United States Patent
Bao

(10) Patent No.: US 8,476,958 B2
(45) Date of Patent: Jul. 2, 2013

(54) MIXER CIRCUIT

(75) Inventor: Mingquan Bao, Vastra Frolunda (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 49 days.

(21) Appl. No.: 13/320,611

(22) PCT Filed: May 20, 2009

(86) PCT No.: PCT/EP2009/056146
§ 371 (c)(1),
(2), (4) Date: Nov. 15, 2011

(87) PCT Pub. No.: WO2010/133253
PCT Pub. Date: Nov. 25, 2010

(65) Prior Publication Data
US 2012/0062304 A1 Mar. 15, 2012

(51) Int. Cl.
*G06F 7/44* (2006.01)
(52) U.S. Cl.
USPC .......................... 327/356; 327/116; 327/119
(58) Field of Classification Search
USPC .......................... 327/116, 119, 356
See application file for complete search history.

(56) References Cited

U.S. PATENT DOCUMENTS

| | | | |
|---|---|---|---|
| 4,636,663 A | 1/1987 | Jongepier et al. | |
| 6,026,286 A * | 2/2000 | Long | 455/327 |
| 6,819,914 B2 * | 11/2004 | Yan et al. | 455/318 |
| 7,263,343 B2 * | 8/2007 | Mitsunaka et al. | 455/292 |
| 8,121,579 B2 * | 2/2012 | Shiramizu et al. | 455/334 |
| 2003/0148751 A1 | 8/2003 | Yan et al. | |
| 2005/0043000 A1 | 2/2005 | Mitsunaka et al. | |

OTHER PUBLICATIONS

Office Action from corresponding EP application No. 09779516.5 dated Feb. 1, 2013, 6 pages.

\* cited by examiner

*Primary Examiner* — Kenneth B. Wells
(74) *Attorney, Agent, or Firm* — Rothwell, Figg, Ernst & Manbeck, P.C.

(57) ABSTRACT

The invention discloses a mixer circuit (10, 20, 30, 410, 60) comprising a first mixer component (11, 21) with a first (13, 23) and a second (12, 22) input port for a first and a second input signal respectively and an output port (14, 24) for outputting a mixed signal. According to the invention, the mixer circuit (10, 20, 30, 410, 60) also comprises a transformer (15) which connects the first (13, 23) and second (12, 22) input ports of the mixer component (11, 21) inductively via an inverting coupling. In one embodiment, the mixer circuit (30, 410, 60) also comprises inputs for DC-bias of one (13) of the input ports and of the output port (14), as well as an impedance (31) as a filter at the output port.

8 Claims, 5 Drawing Sheets

MIXER CIRCUIT

CROSS REFERENCE TO RELATED APPLICATION(S)

This application is a 35 U.S.C. §371 National Phase Entry Application from PCT/EP2009/056146, filed May 20, 2009, designating the United States, the disclosure of which is incorporated herein in its entirety by reference.

TECHNICAL FIELD

The present invention discloses an improved mixer circuit which can be used in, for example, radio transceivers.

BACKGROUND

A mixer circuit is an important building block in, for example, radio transceivers and radar systems, and is usually used to shift a Radio Frequency, RF, signal into an Intermediate Frequency, IF, signal or vice versa. Important parameters in a mixer circuit are, for example, conversion gain, linearity and noise figure, as well as the isolation between different ports of the mixer circuit.

One particular group of mixers are so called active mixers, which comprise such types of mixers as "square law" mixers and "single balanced" mixers.

The square law mixer has a good linearity performance, but has a need for a rather large so called LO, local oscillator, power input, and can also sometimes exhibit an undesirably high noise figure and a low conversion gain. In single balanced mixers, a problem which can occur is poor linearity.

SUMMARY

As stated above, there is a need for a mixer circuit which requires less LO power input than previous mixers and which will also have a lower noise figure and a higher conversion gain than previous mixers. Such a circuit should be possible to use in both "square law" mixers and "single balanced" mixers, as well as "double balanced" mixers, which, as the name suggest, comprise two single balanced mixers.

Such a mixer circuit is offered by the present invention in that it discloses a mixer circuit which comprises a mixer component with a first and a second input port for a first and a second input signal respectively and an output port for outputting a mixed signal. According to the invention, the mixer circuit also comprises a transformer which connects the first and second input ports of the mixer component inductively via an inverting coupling.

As will be described in more detail below, by means of the transformer, the mixer circuit of the invention exhibits improvements in linearity, conversion gain, noise figure and LO power levels.

In one embodiment, the mixer circuit of the invention additionally comprises a second mixer component with first and second input ports for first and second input signals respectively and an output port for outputting a mixed signal, with a transformer which connects the first and second input ports of the second mixer component inductively via an inverting coupling. In this embodiment, the output ports of the first and second mixer components are connected together to form a joint output port.

Suitably, the mixer component is a transistor, either a bipolar transistor or a Field Effect Transistor, a FET. In the case of a bipolar transistor, the first input port or ports is the base of the transistor, the second input port or ports is the emitter of the transistor and the output port or ports is the collector of the transistor. In the case of a FET, a Field Effect Transistor, the first input port or ports is the gate of the transistor, the second input port or ports is the source of the transistor and the output port or ports is the drain of the transistor.

BRIEF DESCRIPTION OF THE DRAWINGS

The invention will be described in more detail in the following, with reference to the appended drawings, in which.

DETAILED DESCRIPTION

The invention will be described in detail in the following by means of a number of examples of embodiments. In the examples of embodiments which will be shown and described, the mixer circuit will consistently be shown as a so called "down-converting mixer", i.e. a mixer which mixes (multiplies) a Radio Frequency, RF, signal with a Local Oscillator, LO, signal in order to produce an output signal at an intermediate frequency, an IF signal.

It should however be pointed out that the mixer circuit of the invention can equally well be used as an "up-converting mixer", i.e. a mixer which mixes (multiplies) an IF signal with an LO signal in order to produce an output signal at RF.

Also, in the examples of embodiments which will be shown in the following, two (or more) signals are applied at one input port each; it should be made clear that the input signals in the examples can be also be applied in the "opposite order", i.e. each input port of the mixer circuit can be used for either input signal.

Figure 1A:
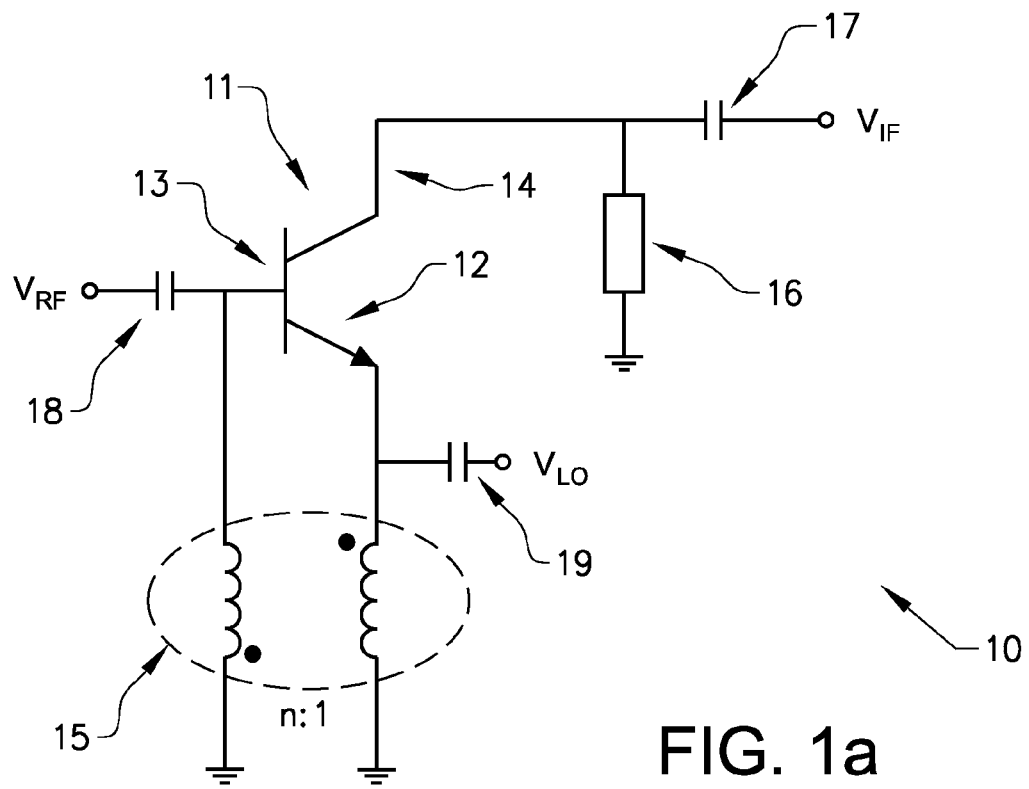
FIGS. 1a, 1b and 2 show basic embodiments of the invention.

FIG. 1a shows a simplified view of a basic embodiment 10 of the invention: a bipolar transistor 11 is used in a so called "square law" mixer configuration. As shown, an RF signal is arranged to be applied at the base 13 of the transistor 11, and an LO signal is arranged to be applied at the emitter 12 of the transistor. Thus, the base 13 and the emitter 12 serve as first and second input ports of the transistor. As can be seen, the RF and LO signals are arranged to be applied via capacitors 18 and 19, as DC shields. An output signal is produced at the collector 14 of the transistor 11, the output signal comprising a product of the input signals, i.e. the RF and the LO signals. The output signal is also arranged to be DC-shielded via a capacitor 17, and there is suitably a load 16 arranged at the output port.

According to the invention, a transformer 15 is comprised in the mixer circuit 10. A first (at the base) and a second (at the emitter) winding of the transformer 15 are used to connect the base 13 and the emitter 12 inductively with each other, in an inverting manner, as indicated by means of the dots in FIG. 1. We can also see that the LO input to the emitter 12 of the transistor 11 is "closer" (serially connected) to the emitter than the windings of the transformer 15. In the example shown in FIG. 1, both windings of the transformer 15 connect to AC ground, with a ratio of n:1 between the windings.

Due to the inverting inductive coupling of the transformer 15, when an LO signal is applied at the emitter 12, an 180° out-of-phase signal will be induced at the base 13 by means of the transformer 15. This will thus increase the amplitude of the voltage difference between the base and the emitter, as compared to a similar prior art mixer without the transformer 15. Similarly, when an RF signal is applied at the base 13, the amplitude of the RF voltage difference between base and emitter is increased, as compared to prior art solutions.

Figure 1B:
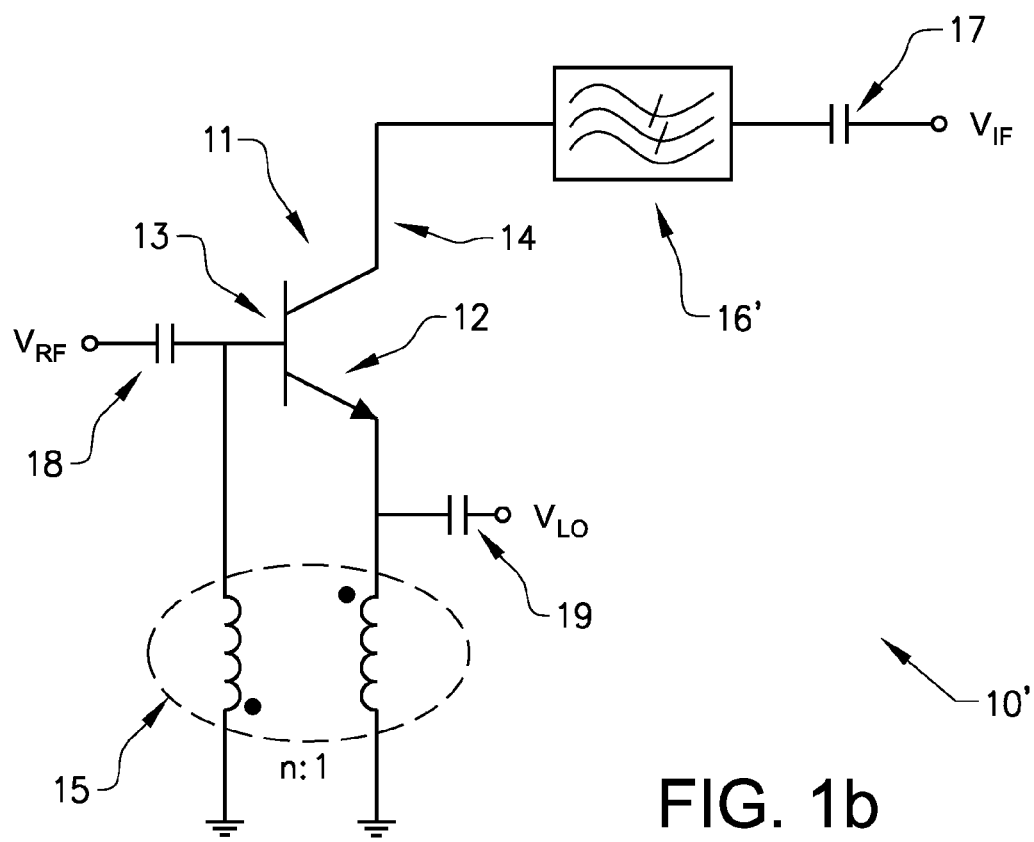

FIG. 1b shows a version of the mixer circuit of FIG. 1a, in which a low pass or band pass filter 16' in series with the capacitor 17 at the output port has replaced the load 16 to AC ground which was shown in FIG. 1a.

An analysis of the effects of the invention will be given in the following. It is well-known that an ideal transformer is characterized by the turns (or windings) ratio, $n=\sqrt{(L_2/L_1)}$, which defines the voltage step up/down from one winding to the other, i.e.

$$V_2 = nV_1 \tag{1}$$

By using equation (1), and taking the "dot convention" into consideration, it can be seen that the LO signal across the base-emitter of the transistor 11 becomes $$V_{be,LO} = -(V_{LO} + nV_{LO}) \tag{2}$$

and the RF signal across the base-emitter of the transistor 11 becomes $$V_{be,RF} = V_{RF} + \frac{1}{n}V_{RF} \tag{3}$$

Thus, using equations (2) and (3), it can be seen that the total base-emitter voltage difference $V_{BE}$ is given by $$V_{be} = V_{RF} + \frac{1}{n}V_{RF} - (V_{LO} + nV_{LO}) \tag{4}$$

The nonlinear relationship between the collector current, $I_c$ and $V_{be}$ is known to be as follows, with coefficients denoted as $c_1, c_2 \ldots c_N$:

$$I_c = c_1 V_{be} + c_2 V_{be}^2 + \tag{5}$$

which results in an IF component ($\omega_{RF} - \omega_{LO}$) existing in $I_c$, if the RF and LO signals are sinusoids as follows:

$$V_{RF}(t) = v_{RF} \cos(\omega_{RF} t) \tag{6a}$$

$$V_{LO}(t) = v_{LO} \cos(\omega_{LO} t) \tag{6b}$$

By means of equations (4), (5) and (6), the IF component in $I_c$ can be seen to be given by:

$$I_{c,\omega_{RF}-\omega_{LO}} = c_2(1+n)\left(1+\frac{1}{n}\right)v_{RF}v_{LO}\cos[(\omega_{RF}-\omega_{LO})t] \tag{7}$$

and the conversion gain $G_C$ is obtained as:

$$G_c = \frac{I_{c,\omega_{RF}-\omega_{LO}}}{v_{RF}} = c_2(1+n)\left(1+\frac{1}{n}\right)v_{LO} \tag{8}$$

For a conventional square-law mixer without the transformer 15, the corresponding conversion gain is given by [1]:

$$G_c = \frac{I_{c,\omega_{RF}-\omega_{LO}}}{v_{RF}} = c_2 v_{LO} \tag{9}$$

Thus, by means of the transformer 15 as disclosed by the invention, the inventive mixer's conversion gain is increased by a factor of $(1+n)(1+1/n)$, where $n>0$, as compared to prior art mixers.

A few words can also be said about the influence of the transformer on the inventive mixer's linearity and noise figure: as seen in equation (2), if the LO voltage swing across the base and the emitter is increased, there will also be an increase in the base-emitter voltage slope. This will benefit the mixer in its linearity performance, which is equal to increasing the LO power level, and thus reducing the power level necessary to fulfil a linearity requirement. The noise figure of the inventive mixer will also be reduced, due to the increase in both conversion gain and LO voltage slope.

Before other embodiments and aspects of the invention are discussed, a few words will be said about the nature of the mixer component which is used in a mixer circuit of the invention: the invention has been described in one embodiment above with reference to FIG. 1a, with the mixer component being shown and referred to as a bipolar transistor. It should, however, be emphasized that a bipolar transistor is only an example of a mixer component which can be used in the present invention. In order to emphasize that other types of mixer components can also be used within the scope of the present invention, an alternative embodiment 20 of the mixer circuit will be shown in FIG. 1b, in which a Field Effect Transistor, a FET, is used instead of the bipolar transistor 11 of FIG. 1.

Figure 2:
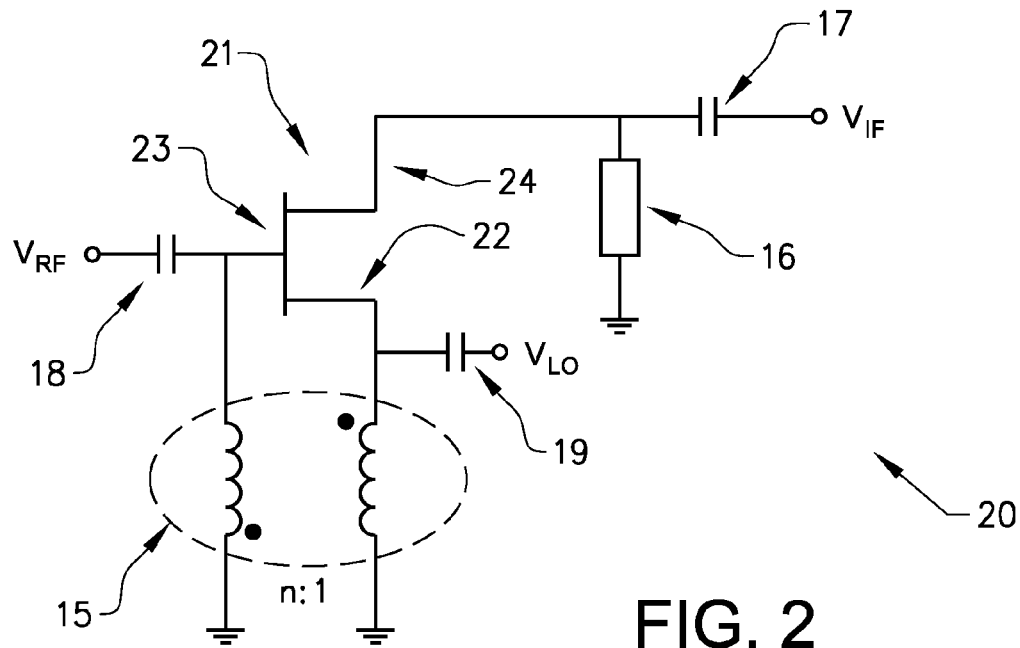

As can be seen in FIG. 2, components which were present in the mixer circuit 10 of FIG. 1 have retained their reference numbers in the embodiment 20 of FIG. 2. Thus, the difference between FIGS. 1 and 2 is that a FET transistor 21 is used, so that a first input port (or ports, in embodiments with multiple FETs) is the gate 23 of the transistor, the second input port (or ports, in embodiments with multiple FETs) is the source 22 of the transistor and the output port (or ports, in embodiments with multiple FETs) is the drain 24 of the transistor 21.

This "replacement" or "substitution" of the bipolar transistor with a FET can be applied to all of the embodiments of the present invention.

Figure 3:
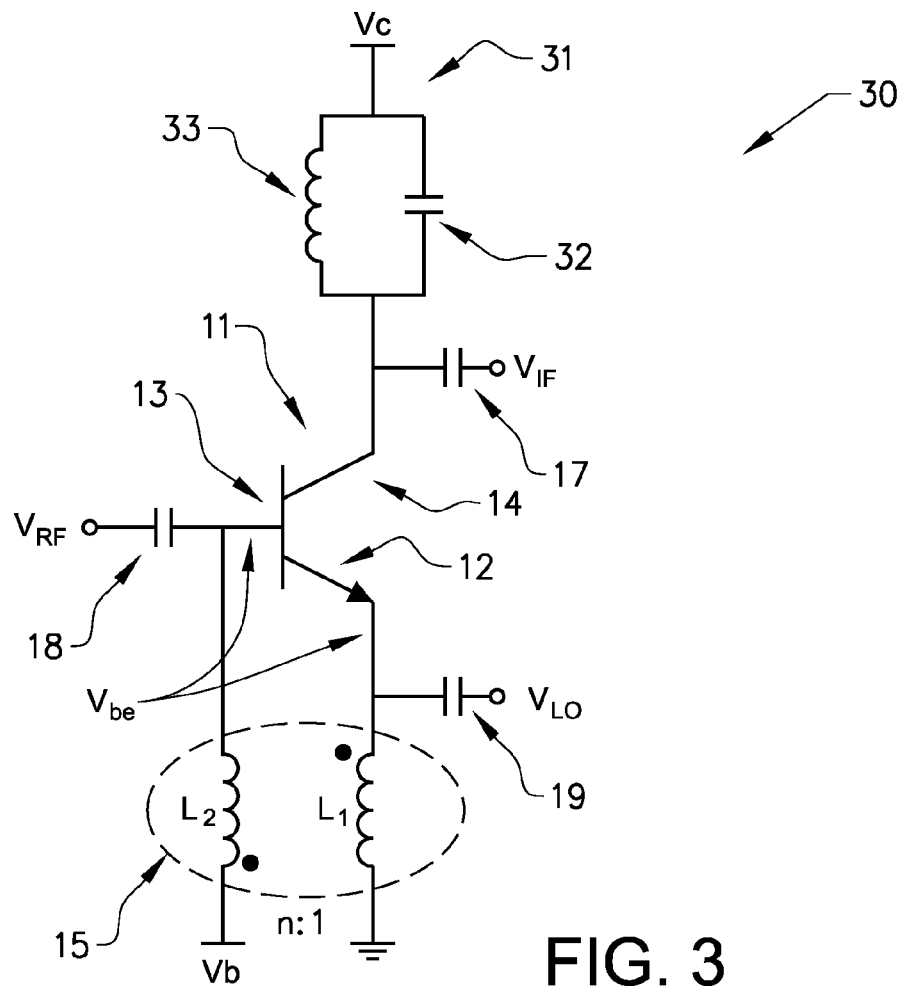
FIG. 3 shows a more detailed version of the embodiment of FIG. 1, and FIGS. 4-6 show further embodiments of the invention.

FIG. 3 shows a more elaborate version 30 of the embodiment 10 of FIG. 1: As seen in FIG. 3, the load or filter 16' has been replaced here by a parallel LC resonator circuit 31 with an inductor 33 and a capacitor 32. The LC resonator circuit 31 is "shunt connected" with the IF port, which is equal to a band pass filter series connected in series with the IF port.

The LC resonator circuit 31 should be designed so that its resonance frequency, $f=1/(2\pi\sqrt{LC})$, is equal to the IF frequency. A voltage VC is applied to the output port 14, i.e. the collector of the transistor, and a voltage $V_b$ is applied to the base 13 of the transistor, in order to provide the transistor with DC bias.

Figure 4:
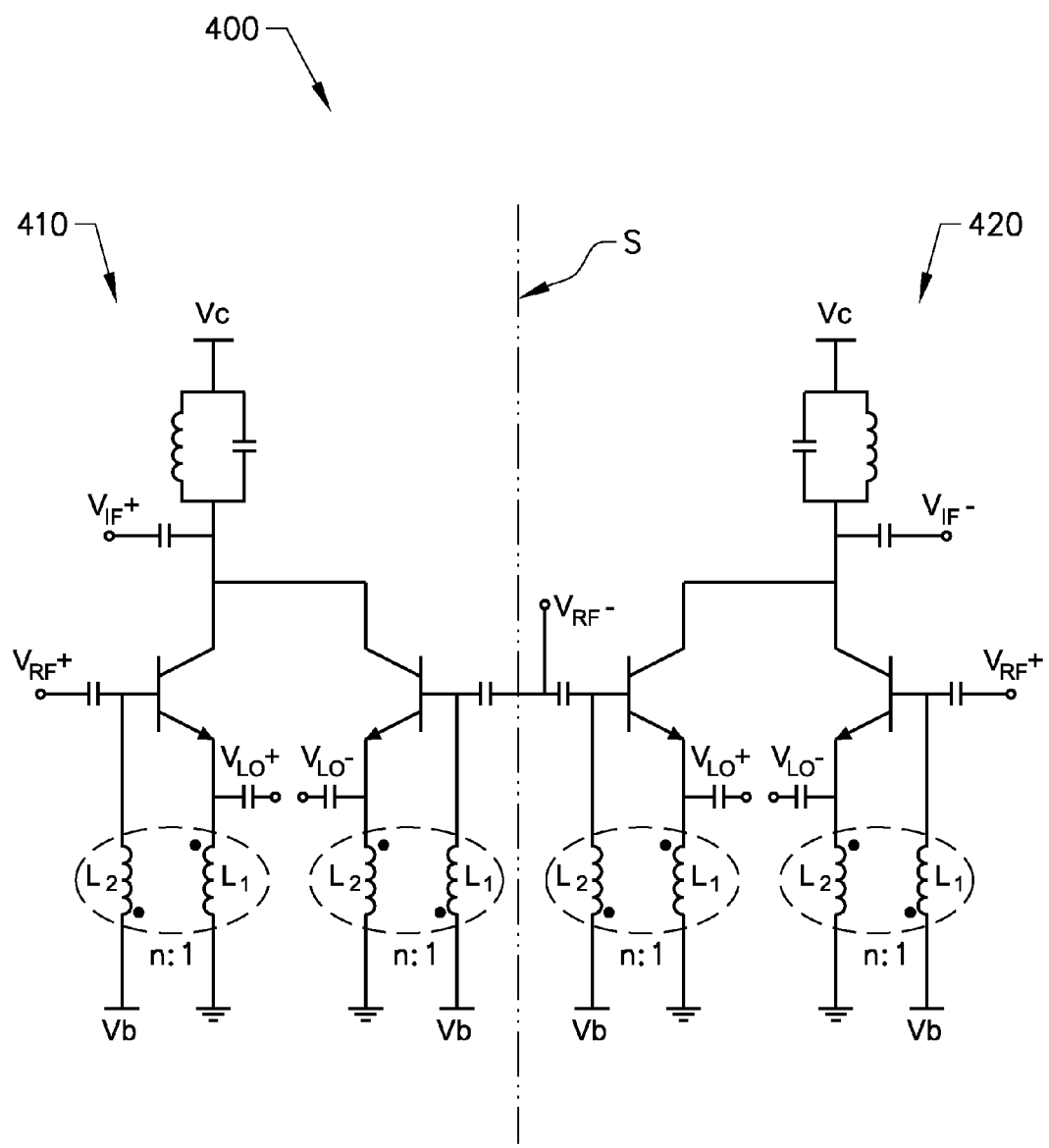

In order to use the invention to increase the isolation between the LO and RF signals, a so called double balanced mixer design can be used, as shown in FIG. 4 in an embodiment 400. As indicated in FIG. 4, the embodiment 400 comprises two essentially similar circuits 410, 420 which are connected to each other, as also indicated by means of a dashed line "S" which indicates the "border" between the two circuits 410, 420. Since the two circuits 410, 420 are essentially similar to each other, only one of them, the circuit 410, will be described in detail, since the symmetry of the design will be realized by looking at FIG. 4.

Figure 5:
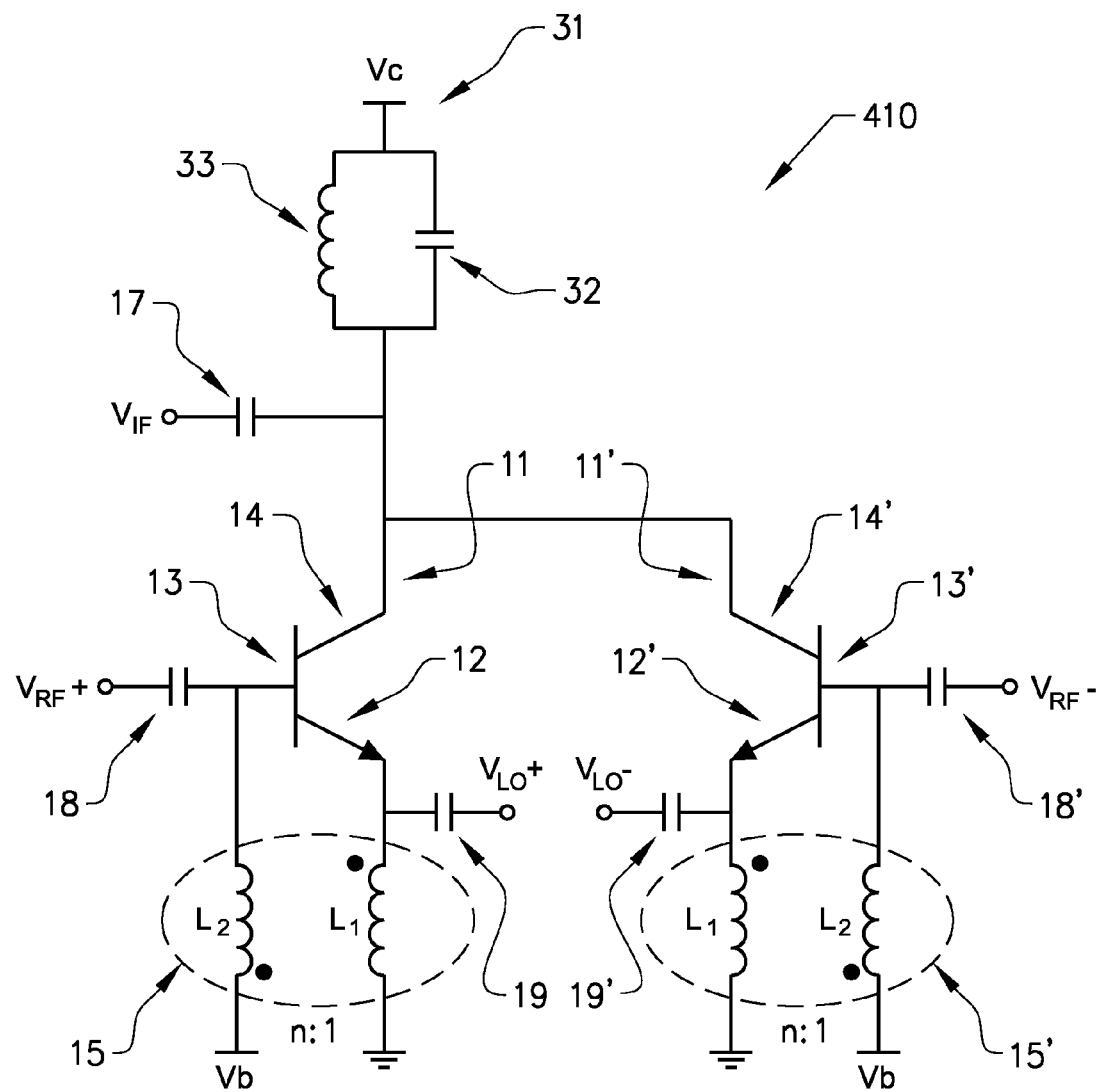

The circuit 410 is shown on its own in FIG. 5. As can be seen, the circuit 410 exhibits many similarities with the circuit 30 of FIG. 3, for which reason components in the circuit 410 which are present in the circuit 30 have retained their reference numbers from FIG. 3. As can be seen in FIG. 5, a difference between the circuits 30 and 410 is that the circuit 410 has an additional transistor 11', which has its emitter 12' and its base 13' connected to each other inductively via an additional transformer 15', which couples the emitter 12' and the base 13' inductively to each other in an inverting manner, as taught by the present invention.

The two transistors 11 and 11' of the embodiment 410 are connected to each other via their respective collectors 14, 14', which connect to an output $V_{IF}$ which can be accessed via the capacitor 17. The emitters 12, 12' of the two transistors form inputs for "positive" and "negative" LO signals $V_{LO}+$, $V_{LO}-$, and are accessed via respective capacitors 19, 19'. The base 13, 13' of each transistor form inputs for "positive" and "negative" RF signals, $V_{RF}+$, $V_{RF}-$, and are accessed via respective capacitors 18, 18'.

Returning now to the embodiment 400 of FIG. 4, it can be seen that the double balanced design 400 of FIG. 4 comprises two essentially similar circuits 410, 420, with the circuit 410 having been shown and described in FIG. 5. In the circuit 400, the two circuits 410, 420, are connected to each other via the base of one of their transistors, in this particular case the transistor which serves as input for $V_{RF}+$ and $V_{RF}-$. In this way, as shown in FIG. 4, the circuit 400 has two inputs, positive and negative, for each of the signals $V_{RF}$, $V_{LO}$, and also exhibits output terminals for a positive and a negative $V_{IF}$ signal.

A further embodiment 60 of the invention will now be described with reference to FIG. 6. The embodiment 60 is based on a so called "single balanced" mixer design, and comprises two essentially similar parts, shown as 79 and 78 in FIG. 6 and separated by means of dashed lines. As can be seen, the two parts 79 and 78 are each other's "mirror images", and there is in addition a third part which will also be described below.

The part 79 will be described here since it is representative of the part 78 as well, due to the "mirror similarity" between the parts 79 and 78. Components in the part 79 which have been described in previous embodiments have been given corresponding reference numbers in FIG. 6.

The part 79 comprises a bipolar transistor 11, in which the base 13 and the emitter 12 serve as first and second input ports for a first and a second input signal respectively, and the collector 14 serves as output port for outputting a mixed signal. The base 13 and the emitter 12 are inductively coupled to each other via a transformer 15, which is arranged to couple them to each other in an inverting manner. However, as opposed to the previous embodiments, the signal which is input to the base 13 in the part 79 is a biasing voltage, $V_b$, which is input via the transformer 15.

As can be seen, the two parts 79 and 78 are connected to each other via their emitters 12, 72, with the connection being "outside" of the transformer, i.e. each emitter 12, 72 is connected serially first to "its" transformer 15, 75, and then to the emitter of the transistor of the other part.

Thus, the two emitters 12, 72 are connected to each other, and also to a third transistor 61, to the collector 64 of that transistor. The emitter 62 of the third transistor 61 is in this embodiment connected to ground, and the base 63 of the third transistor 61 serves as input for an RF signal which is to be mixed, i.e. in this case down-converted, to an IF frequency in the mixer circuit 60. A biasing voltage $V_{b1}$ is also input to the base 63 of the third transistor, and the port for the RF signal connects to the base 63 via a DC shielding capacitor 68.

Figure 6:
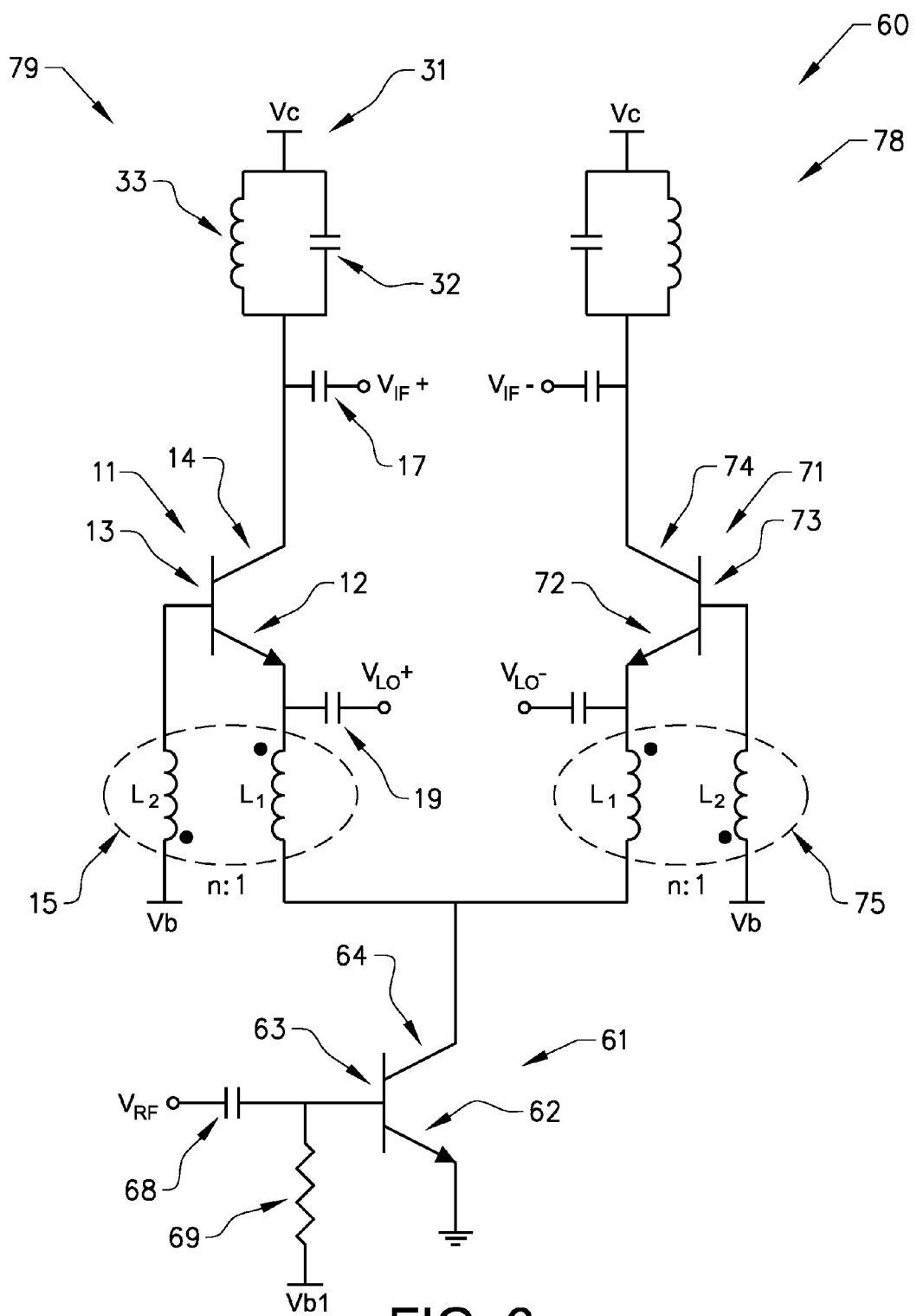

As is shown in FIG. 6, the emitters of the transistors in the two parts 79 and 78 serve as inputs for positive and negative LO signals, shown as $V_{LO}+$ and $V_{LO}-$ in FIG. 6, and the collectors of the transistors in the two parts 79 and 78 serve as outputs for positive and negative IF signals, shown as $V_{IF}+$ and $V_{IF}-$ in FIG. 6.

As is evident, the invention can be utilized in numerous fashions, by means of connecting two input ports of a transistor to each other inductively in an inverting manner, by means of a transformer. All such embodiments are naturally within the scope of the present invention. With renewed reference to the embodiment shown in FIG. 6, it should be pointed out that this embodiment can, for example, be utilized in so called Gilbert mixers, which as such are a well known kind of double balanced mixer.

The invention is not limited to the examples of embodiments described above and shown in the drawings, but may be freely varied within the scope of the appended claims.

The invention claimed is:

1. A mixer circuit comprising a transistor as a first mixer component with a first and a second input port for a first and a second input signal respectively and an output port for outputting a mixed signal, the mixer circuit further comprising a transformer which connects the first and second input ports of the mixer component inductively via an inverting coupling.

2. The mixer circuit of claim 1, further comprising inputs for DC-bias of one of the input ports and of the output port, as well as an impedance as a load at the output port.

3. The mixer circuit of claim 1 wherein a connection to the input ports comprises a capacitance as a DC shield.

4. The mixer circuit of claim 1, wherein a connection to the output port exhibits a capacitance as a DC shield.

5. The mixer circuit of claim 1, further comprising a second mixer component with first and second input ports for first and second input signals respectively and an output port for outputting a mixed second signal, with a transformer which connects the first and second input ports of the second mixer component inductively via an inverting coupling, in which mixer circuit the output ports of the first and second mixer components are connected together to form a joint output port.

6. The mixer circuit of claim 1, further comprising a second mixer component with first and second input ports for first and second input signals respectively and an output port, with a transformer which connects the first and second input ports of the second mixer component inductively via an inverting coupling, in which mixer circuit the output ports of the first and second mixer components are connected together to form a joint output port, and the first input ports of each mixer component are arranged to be used for inputting a biasing voltage, the mixer circuit comprising an additional mixer component with first and second input ports, and an output port which is connected to said joint input port of the first and second mixer components.

7. The mixer circuit of claim 6, wherein the transistor is a bipolar transistor, the first input port or ports is the base of the transistor, the second input port or ports is the emitter of the transistor and the output port or ports is the collector the transistor.

8. The mixer circuit of claim 6, in which the transistor is a FET, a Field Effect Transistor, wherein the first input port or ports is the gate of the transistor, the second input port or ports is the source of the transistor and the output port or ports is the drain of the transistor.

* * * * *